(12) United States Patent
Seuring (10) Patent No.: US 7,689,884 B2
(45) Date of Patent: Mar. 30, 2010

(54) MULTICORE CHIP TEST

(75) Inventor: Markus Seuring, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 359 days.

(21) Appl. No.: 11/789,269

(22) Filed: Apr. 23, 2007

(65) Prior Publication Data

US 2008/0148117 A1    Jun. 19, 2008

(30) Foreign Application Priority Data

Dec. 14, 2006    (DE) .................. 10 2006 059 158

(51) Int. Cl.
   *G01R 31/28* (2006.01)
   *G06F 11/00* (2006.01)
(52) U.S. Cl. .................. 714/729; 714/724; 714/726; 714/736; 714/742
(58) Field of Classification Search .......... 714/724, 714/726, 729, 736, 742
See application file for complete search history.

(56) References Cited

U.S. PATENT DOCUMENTS

| | | | | |
|---|---|---|---|---|
| 5,732,209 | A * | 3/1998 | Vigil et al. ............. | 714/30 |
| 5,809,040 | A * | 9/1998 | Dallmann et al. ....... | 714/736 |
| 6,134,675 | A * | 10/2000 | Raina ................... | 714/37 |
| 6,557,129 | B1 * | 4/2003 | Rajski et al. ........... | 714/729 |
| 7,080,283 | B1 * | 7/2006 | Songer et al. .......... | 714/30 |
| 7,231,570 | B2 * | 6/2007 | Wang et al. ............ | 714/729 |
| 7,263,642 | B1 * | 8/2007 | Makar et al. ........... | 714/736 |
| 7,313,739 | B2 * | 12/2007 | Menon et al. .......... | 714/718 |
| 7,512,851 | B2 * | 3/2009 | Wang et al. ............ | 714/726 |
| 2003/0098457 | A1 * | 5/2003 | Whetsel et al. ......... | 257/48 |
| 2005/0204217 | A1 * | 9/2005 | Whetsel et al. ......... | 714/724 |
| 2008/0104466 | A1 * | 5/2008 | Menon et al. .......... | 714/727 |

FOREIGN PATENT DOCUMENTS

| | | |
|---|---|---|
| DE | 19536226 | 3/1997 |
| WO | 0138889 | 5/2001 |
| WO | 0138890 | 5/2001 |

OTHER PUBLICATIONS

"A Scalable Test Mechanism and Its Optimization for Test Access to Embedded Cores" by He Hu and Sun Yihe This paper appears in: ASIC, 2001. Proceedings. 4th International Conference on Publication Date: 2001 On pp. 773-776 ISBN: 0-7803-6677-8 INSPEC Accession No. 7260840.*

(Continued)

*Primary Examiner*—John J Tabone, Jr.
(74) *Attorney, Agent, or Firm*—Meyertons, Hood, Kivlin, Kowert & Goetzel, P.C.

(57) ABSTRACT

An integrated chip architecture is provided which allows for efficiently testing multiple cores included in the integrated chip architecture. In particular, the provided approach enables the test time and the number of required Input/Output test pins is nearly independent from the number of cores included in the multicore chip. The presented embodiments provide a multicore chip architecture which allows for providing input data to the multiple cores in parallel for simultaneously testing the multiple cores, and analyzing the resulting multiple test outputs on chip. As a result of this analysis embodiments may store on chip an indication for those cores that have not successfully passed the test.

18 Claims, 7 Drawing Sheets

OTHER PUBLICATIONS

"Addressable Test Ports an Approach to Testing Embedded Cores" by Whetsel, L. This paper appears in: Test Conference, 1999. Proceedings. International Publication Date: 1999 On pp. 1055-1064 ISBN: 0-7803-5753-1 INSPEC Accession No. 6543625.*

Zeng et al., Concurrent Core Test for SOC Using Shared Test Set and Scan Chain Disable, IEEE, vol. 1, Mar. 6-10, 2006 pp. 1-6.*
Translation of Official Communication, Application No. 10 2006 059 158.5-35, Issued Aug. 1. 2007.
U.S. Appl. No. 11/789,369, filed Apr. 23, 2007.

* cited by examiner

Mask logic for a single scan channel

FIG. 6

Compare logic for a single scan channel

MULTICORE CHIP TEST

BACKGROUND OF THE INVENTION

1. Field of the Invention

The invention generally relates to testing of semiconductor devices, and more particularly to testing of integrated circuits which include multiple cores.

2. Description of the Related Art

The manufacturing of integrated circuits includes testing of the circuits to ensure their proper operation and to gain information about possible failures. Integrated circuits of low complexity may be tested using functional tests, for which test patterns or test vectors may be applied to the integrated circuit (also referred to as "chip") by an automated test equipment (ATE), wherein the test patterns may be developed to prove the complete functionality of this integrated circuit. However, for integrated circuits with high complexity, it may be more efficient to test each block of the chip separately rather than testing the complete chip as a whole. In this case, the ATE may provide dedicated test patterns for each structural block that is to be tested within the integrated circuit. The resulting output is in turn captured by the ATE where it is analyzed.

Figure 1:
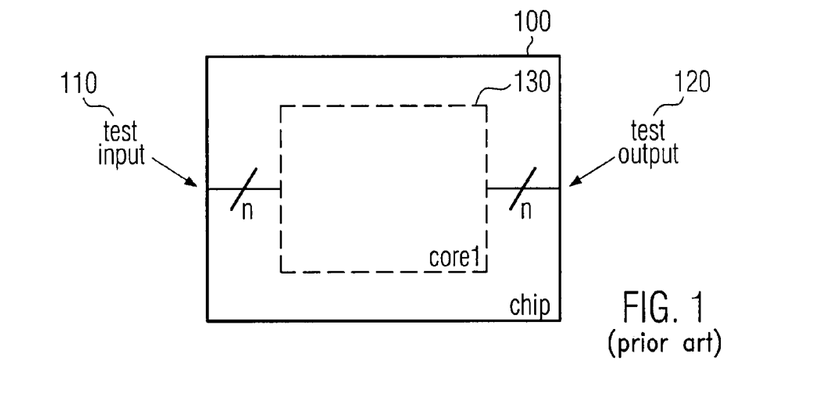
FIG. 1 is a block diagram illustrating a single-core chip architecture.

FIG. 1 illustrates an example for an integrated circuit chip to be tested. Chip 100 comprises a core 130, which may include random logic such as a processor core. Furthermore, chip 100 includes one test input 110, which may be an n-bit port at which an ATE can apply an n-bit test vector, thereby supplying the n-bit test vector to the core 130 via an n-bit bus. Furthermore, the chip 100 includes a test output 120, which may be an n-bit port that is connected to the core 130 over an n-bit bus, thereby enabling the ATE to capture output data of the core 130 that result when operating the core 130 with the test input data.

Due to the ongoing advancements in shrinking the feature sizes of semiconductor devices and the resulting increase in chip complexity, the semiconductor industry tries to manufacture integrated circuit chips which integrate several components of a system which were previously manufactured as separate semiconductor chips. For example, one semiconductor chip may include several processor cores which are substantially identical, thereby resulting in a single-chip multiprocessor.

Figure 2:
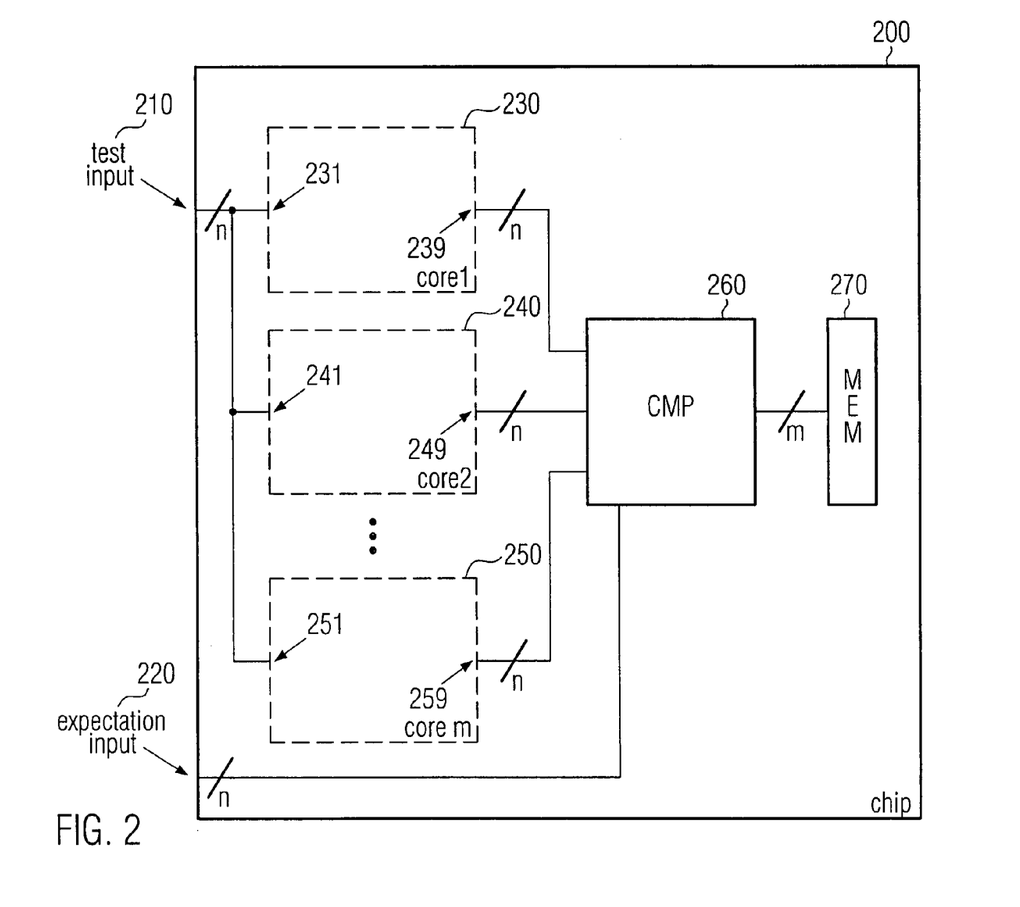
FIG. 2 is a block diagram illustrating a multicore chip architecture according to an embodiment.

Testing such multicore chips in the conventional manner shown in FIG. 2 would result in a substantial increase of test time and required Input/Output pins. Therefore, the issue arises of how to efficiently test the circuitry of integrated circuits which have a plurality of substantially similar cores.

SUMMARY OF THE INVENTION

An integrated circuit chip architecture and method are provided that may improve the efficiency of testing an integrated circuit chip with a plurality of circuitry cores.

In one embodiment, an integrated circuit chip architecture is provided which comprises a test input for receiving test data and an expectation input for receiving expected result data. Furthermore, the integrated circuit chip architecture comprises at least two circuitry cores, wherein each core has a core test input and a core test output. Each core is configured to receive test data from the test input at the core test input, to generate test result data according to test data received at the core test input, and to provide the generated test result data at the core test output. The integrated circuit chip architecture further comprises comparator circuitry configured to compare test result data of each core with expected result data from the expectation input to detect whether or not there is a mismatch between the test result data and the expected result data. The integrated circuit chip architecture further comprises a memory configured to store a mismatch indication for each circuitry core.

In another embodiment, there is provided a method for an integrated circuit chip for testing the circuitry of at least two circuitry cores included in the integrated circuit chip. The method comprises receiving test data at a test input of the integrated circuit chip and receiving expected result data at an expectation input of the integrated circuit chip. The method further comprises providing the received test data to core test inputs of the circuitry cores. In the circuitry cores, test result data according to the provided test data are generated and provided to respective core test outputs. The method further comprises comparing the test result data of each of the circuitry cores with the expected result data in a comparator circuitry of the integrated circuit chip to detect whether or not there is a mismatch between the test result data and the expected result data. Furthermore, the method comprises storing a mismatch indication for each of the circuit in a memory of the integrated circuit chip.

BRIEF DESCRIPTION OF THE DRAWINGS

The accompanying drawings are incorporated into and form a part of the specification for the purpose of explaining the principles of the invention. The drawings are not to be construed as limiting the invention to only the illustrated and described examples of how the invention can be made and used. Further features and advantages will become apparent from the following and more particular description of the invention, as illustrated in the accompanying drawings, wherein.

DETAILED DESCRIPTION OF THE INVENTION

The illustrative embodiments of the present invention will be described with reference to the figure drawings wherein like elements and structures are indicated by like reference numbers.

As will be described in more detail below, embodiments allow for efficiently testing semiconductor chips with multicore design. The testing of such multicore designs may benefit from the fact that the cores are substantially similar, meaning that they are usually identical except for a very small fraction of the design. Therefore, tests for one core are mostly applicable for all cores. This applicability of the same tests for all cores of a multicore chip is utilized by the embodiments to enable an efficient testing of the chips.

For enabling an efficient test of multicore chip designs, several additional issues have to be considered compared to testing single-core designs. For example, FIG. 1 shows a single core chip architecture in which test patterns for testing the core 130 of the chip 100 are provided to the core 100 via test input 110, and the corresponding test results are output via a test output 120. An ATE may be connected to the test input 110 and to the test output 120 to provide the test patterns and to receive the corresponding test results. Applying this approach to a multicore design would result in a multicore chip architecture which includes multiple cores as well as multiple test inputs and multiple test outputs, each of them dedicated to a certain core. Then, an ATE would be connected to the test inputs/test outputs of the cores one after another. However, such a serial approach of testing each core separately one after another would multiply the test time according to the number of cores. In addition, the provision of a test input and a test output for each core multiplies the number of input/output pins of such a multicore chip. On the other hand, when sharing the test input pins between all cores but connecting each core to dedicated scan output pins might reduce the test time penalty, but adding cores to such a design means less test data throughput so that the test time increases.

Therefore, the presented embodiments provide a multicore chip architecture which allows for providing input data to the multiple cores in parallel for simultaneously testing the multiple cores, and analyzing the resulting multiple test outputs on chip. As a result of this analysis embodiments may store on chip an indication for those cores that have not successfully passed the test. In this manner, the time for testing the multicore chip is nearly independent from the number of substantially similar cores on chip, meaning that the multicore chip may be tested almost in the same time as a single core chip.

Furthermore, the embodiments do not require that the total number of input/output pins is increased compared to testing a single core chip. As will be described in more detail below, expected result data are supplied to a multicore chip via input pins that replace the output pins of the single core chip architecture.

Referring now to FIG. 2, a multicore chip architecture 200 is shown which comprises two substantially similar cores 230 (core 1), 240 (core 2) and 250 (core m). Although three cores are shown, any other number of substantially similar cores may be used. It has to be noted that other cores and circuit units may be also included in the multicore chip architecture 200, but only those cores 230, 240 and 250 are shown which are substantially similar. Each of the cores 230, 240 and 250 is connected to the test input 210, which may represent an input port of n pads or pins. An ATE may be connected to the test input 210 through which the ATE may supply test data for testing the cores 230, 240 and 250. In an embodiment, the test data may be provided as n-bit test patterns or test vectors which may be supplied via an n-bit bus to the separate cores 230, 240 and 250. As shown in FIG. 2, the n-bit bus may be configured to provide the test patterns concurrently to the separate cores 230, 240 and 250 so that the multiple cores can be tested in parallel. Therefore, the multiple cores 230, 240 and 250 may receive the test patterns simultaneously on their respective core test inputs 231, 241 and 251 and, accordingly, may provide resulting test result data on their respective core test outputs 239, 249 and 259.

For example, a sequence of n-bit test patterns may be simultaneously received at the core inputs 231, 241 and 251 of the multiple cores 230, 240 and 250. Triggered by a chip test clock, the sequence of test patterns may be sequentially shifted into each of the multiple cores. Correspondingly, a sequence of test result patterns is shifted out from the multiple cores 230, 240 and 250 at their respective core test outputs 239, 249 and 259.

As shown in FIG. 2, the n-bit test result patterns may be provided via an n-bit bus to the comparator circuitry 260. Each of the cores 230, 240 and 250 may be connected to the comparator circuitry 260 via a separate n-bit bus so that the test result patterns output from core 1 as well as the test result patterns output from core 2 and the test result patterns output from core m are received simultaneously at separate input ports of the comparator circuitry 260. In other embodiments, it may be possible that the test result data output from the multiple cores are input into the comparator circuitry 260 via a single input port in a multiplexed manner. In further embodiments, it may be possible that the connections between the multiple cores 230, 240 and 250 and the comparator circuitry 260 may have a smaller width than n-bit; then, the n-bit test result patterns may be provided to the comparator circuitry 260 in a coded or compressed manner. In the embodiment shown in FIG. 2, m cores 230, 240 and 250 output m n-bit patterns which are received by the comparator circuitry 260 in parallel.

Furthermore, the multicore chip 200 comprises an expectation input 220 over which the multicore chip 200 may receive expected test result data. In an embodiment, the expectation input 220 may be an n-bit input port with n pins or pads to which an ATE may be connected to provide expected test result data which correspond to the provided test input data. The expected test result data represents test responses to the test input data in the case of a properly operating circuitry core. The expected test result data may be input via the expectation input 220 as n-bit expected result patterns and provided via an n-bit bus to the comparator circuitry 260. The comparator circuitry 260 analyzes whether the test output data of each core 230, 240 and 250 correspond to the expected results data. For example, the comparator circuitry 260 may receive a test output pattern from core m and a corresponding expected result pattern from the expectation input 220. Then, the comparator circuitry 260 detects whether there is any mismatch between the test output data from core m and the corresponding expected result pattern by comparing them. If a mismatch is detected, a mismatch indication is generated indicating the detected mismatch.

For example, if the value of one bit of an n-bit test output pattern does not match with the value of the corresponding bit of the corresponding expected result pattern, the comparator circuitry 260 may generate a fail bit indicating that a certain core has generated a test output pattern which does not match with the expected result pattern. This analysis and mismatch detection is made in the comparator circuitry 260 for each of the multiple cores 230, 240 and 250.

Furthermore, the multicore chip 200 comprises a memory 270 which is connected to the comparator circuitry 260. In the memory 270, the mismatch indications generated by the comparator circuitry 260 for each of the multiple cores 230, 240 and 250 may be stored. The memory 270 may be connected to the comparator circuitry 260 via an m-bit bus so that the mismatch indications for the separate cores may be provided in parallel from the comparator circuitry 260 to the memory 270. In other embodiments, the mismatch indications may be provided serially, multiplexed or coded to the memory 270.

In further embodiments, the core test outputs 239, 249 and 259 may be separately connected to the expectation input 220. This may allow for performing a conventional test of a single core of the multiple cores by using the expectation input as a test output to which the ATE is connected. This may be useful if a more detailed analysis of the test results shall be performed in the ATE.

In further embodiments, the memory 270 may be connected to the expectation input 220 so that the mismatch indications may be read out from memory 270 in a readout mode.

Figure 3:
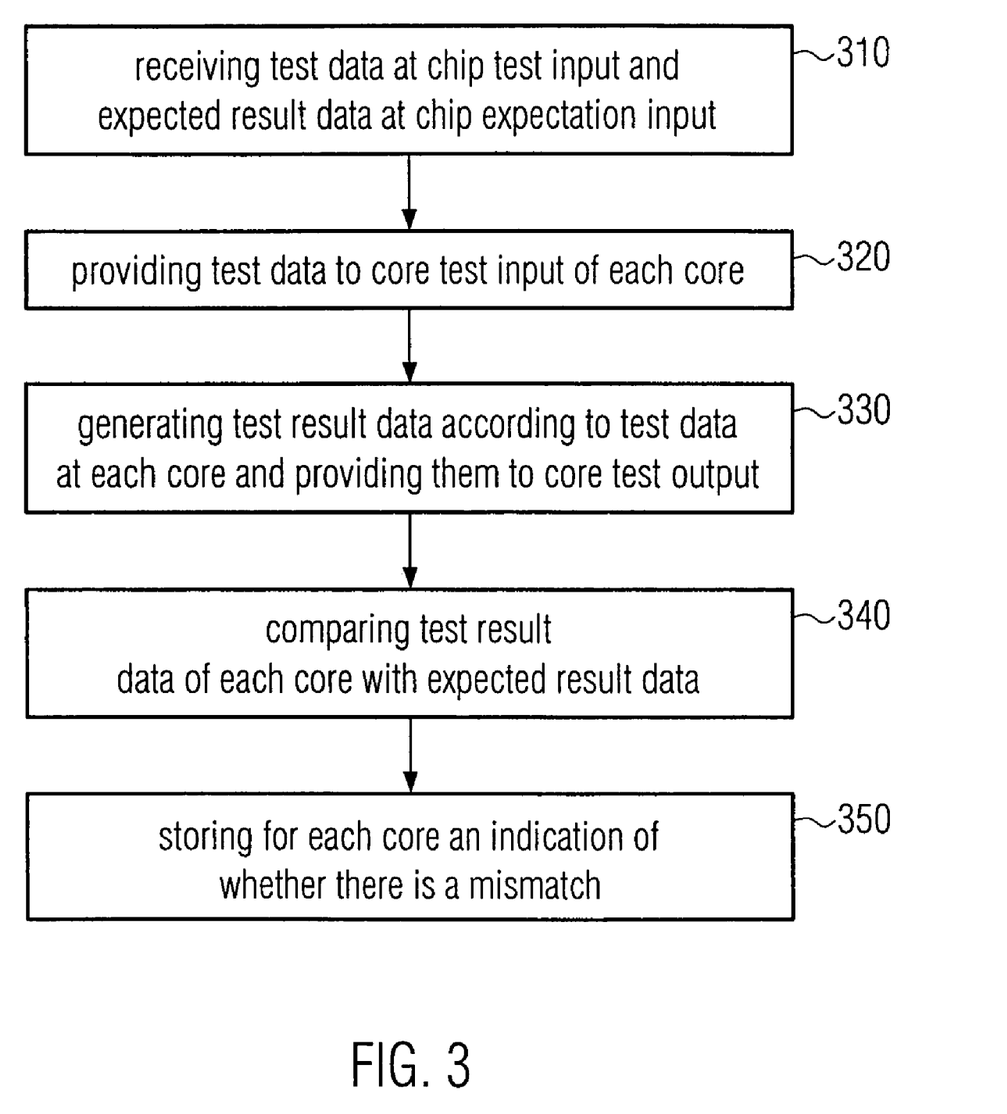
FIG. 3 is a flow chart illustrating a multicore chip testing method according to an embodiment.

Referring now to FIG. 3, an exemplary multicore chip testing method is shown according to an embodiment. In step 310, test data for testing the multiple cores of a multicore chip are received at a chip test input of the multicore chip, and expected results data indicating properly working circuitry of a core are received at an expectation input of a multicore chip. In step 320, the received test data are provided to the multiple cores and received by them at respective core test inputs. In step 330, each of the multiple cores generates test result data by applying the received test data to the circuitry of the core, and each core provides the test result data to a core test output. In step 340, for each core any mismatch between its generated test result data and the expected results data is detected by on-chip comparing the test result data with the expected result data. In step 350, for each core of the multicore chip an mismatch indication is stored in an on-chip memory.

Figure 4:
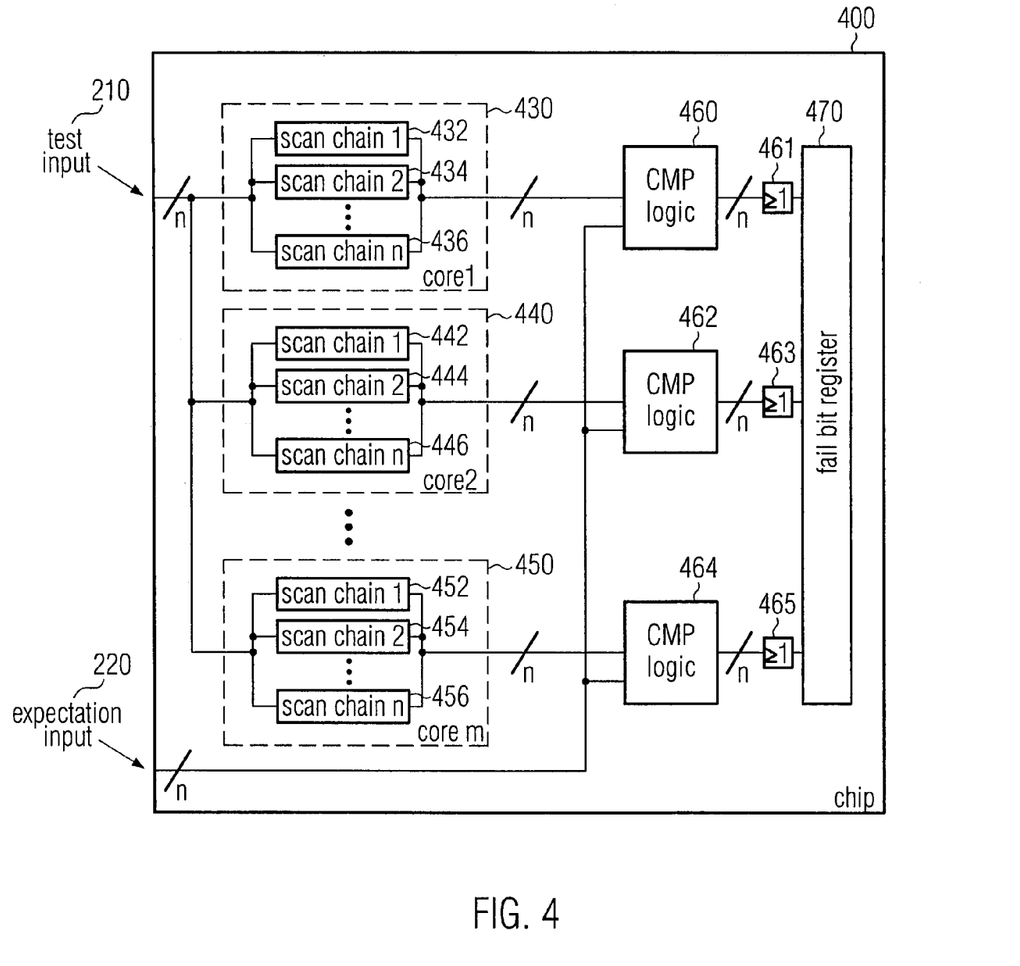
FIG. 4 is a block diagram illustrating a multicore chip architecture according to another embodiment.

Referring now to FIG. 4, there is provided a multicore chip architecture 400 in which the multiple cores 430, 440 and 450 may be tested via a scan chain approach.

In a scan chain approach, logic circuitry is tested by so-called scan chains, which represent a chain of registers (flip-flops or latches) connected to the logic circuitry of the core in such a manner that access to internal nodes of the core is gained. The internal nodes of the core to which the registers of one or more scan chains are connected may be initialized with a desired state that has previously been shifted into the registers of the one or more scan chains in an initialization mode. In test mode, one or more clock signals may be provided to the logic circuitry of the core, and the state of each internal node connected to the one or more scan chains may be captured in the corresponding registers of the one or mores scan chains and may be shifted out by supplying shift clock signals to the one or more scan chains. Thus, test patterns for testing the internal circuitry of a core may be shifted in via the one or more scan chains, clock signals may be applied to test the internal circuitry with the test patterns and corresponding test results may be shifted out from the one or more scan chains. Depending on the test patterns supplied to the one or more scan chains, it can be determined which result patterns would be shifted out from the one or more scan chains if the internal circuitry of the core is operating properly; these result patterns are provided as expected result patterns. Therefore, if the actually output result patterns do not correspond to the expected result patterns, it can be derived that internal logic gates, which represent the internal nodes to which the registers of the one or more scan chains are connected, may be faulty. In this manner, faulty cores within the multicore chip may be identified.

In FIG. 4, each of the m cores 430, 440 and 450 includes n scan chains. For example, core 430 (core 1) comprises scan chains 432 (scan chain 1), scan 434 (scan chain 2) and 436 (scan chain n). It has to be noted that although only three scan chains 432, 434, 436 are shown, any number n of scan chains may be included in each of the multiple cores. Similarly, core 440 (core 2) comprises scan chains 442, 444 and 446, and core 450 (core m) comprises scan chains 452, 454 and 456.

At test input 210, test input patterns may be supplied to the multicore chip 400. The test input patterns may be provided as n-bit input patterns by an ATE. The n-bit test input patterns may be supplied simultaneously to the core test inputs of the multiple cores 430, 440 and 450 via an n-bit bus. The n-bit test patterns are used to feed the test data into the n scan chains 432, 434, 436, 442, 444, 446, 452, 454 and 456 of the multiple cores 430, 440 and 450. The n outputs of the n scan chains of each core allow for shifting out test responses that are stored during one or more captured cycles in the scan registers of the n scan chains, thereby providing an n-bit test pattern or test vector at the core test output of each of the multiple cores 430, 440 and 450. In addition to the test responses from the multiple cores 430, 440 and 450, the multicore chip 400 also receives expected test responses for a fault-free internal circuitry of the multiple cores at the expectation input 220. The expected test responses may be provided as n-bit expected result patterns by the ATE. The multicore chip 400 further comprises comparator logic units 460, 462 and 464, wherein comparator logic unit 460 is directly connected to core 430 (core 1), comparator logic unit 462 is directly connected to core 440 (core 2), and comparator logic 464 is directly connected to core 450 (core m). Furthermore, each comparator logic unit 460, 462 and 464 is connected to the expectation input 220. It is the duty of the comparator logic units 460, 462 and 464 to determine whether or not the input test patterns, which are shared between all m cores, cause each of the m cores 430, 440 and 450 to generate test result patterns which match with the expected result patterns which are also shared between all cores. For example, comparator logic unit 460 compares the test result pattern received from core 430 to the expected result pattern received from the expectation input 220. If there is any mismatch detected, an indication for this mismatch is generated and provided to the memory 470. In an embodiment, comparator logic unit 460 performs a bit-by-bit comparison of the received test result pattern and the received expected test result pattern, and outputs the comparison results as n-bit comparison vector. For example, in case of a mismatch between a certain bit of the received test result pattern and a corresponding bit of the received expected result pattern, a bit may be output with the value "1". In case that the received test result pattern and the received expected result pattern do exactly match, a bit may be output with the value "0". Then, the n-bit comparison vector is supplied to an OR-gate 461 which outputs a "0" in case that all bits of the comparison vector have the value "0", and outputs a "1" in case that at least one bit of the comparison vector has the value "1". The output of the OR-gate 461 may be stored as a fail bit in a memory of the multicore chip 400 as a mismatch indication value. A fail bit value of "1" may indicated a detected mismatch; otherwise, a fail bit value of "0" may indicate that no mismatch has been detected and may be therefore regarded as a pass bit.

In the same manner, comparator logic unit 462 compares the test result pattern of 440 with the expected result pattern, and according to the resulting comparison vector an OR-gate 463 may provide and a respective mismatch indication value to the memory 470. Similarly, comparator logic unit 464 compares the test result pattern of 450 with the expected result pattern, and via OR-gate 465 a mismatch indication value may be provided to the memory 470, if the comparator logic unit 464 detects any mismatch. In an embodiment, the memory 470 may include a plurality of fail bit registers associated with the comparator logic units 460, 462 and 464. For example, the fail bit register may include one register directly connected to the OR-gate 461, one register directly connected to the OR-gate 463 and one register directly connected to the OR-gate 465.

In further embodiments, the core test outputs of cores 430, 440 and 450 or the outputs of the comparator logic units 460, 462 and 464 may be separately connected to the expectation input 220. This may allow for performing a conventional test of a single core of the multiple cores by using the expectation input as a test output to which the ATE is connected. This may be useful if a more detailed analysis of the test results shall be performed in the ATE.

In further embodiments, the memory 470 may be connected to the expectation input 220 so that the mismatch indication values may be read out from the failbit registers included in memory 470 in a readout mode. In other embodiments, the fail bit registers included in memory 470 may be read out via a test access port (TAP).

Figure 5:
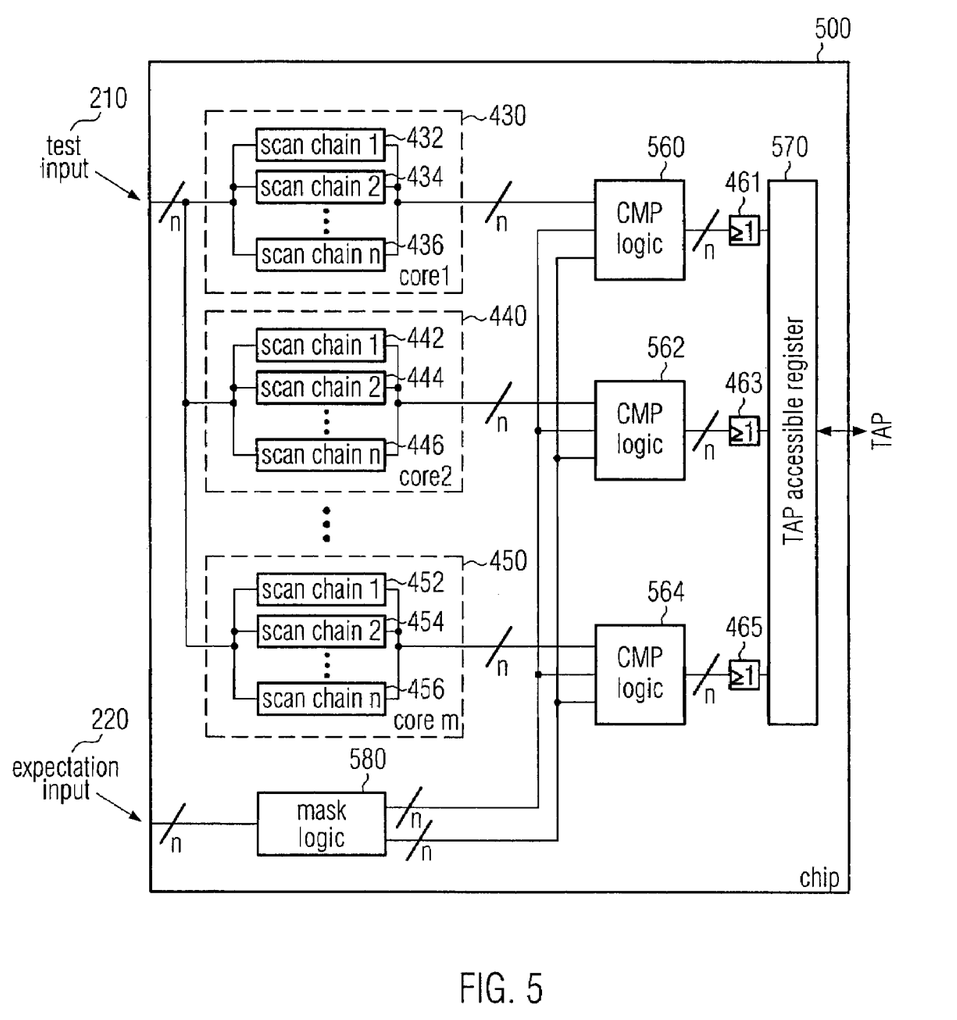
FIG. 5 is a block diagram illustrating a multicore chip architecture according to a further embodiment.

FIG. 5 shows a further embodiment in which the multiple cores 430, 440 and 450, the test input 210, the expectation input 220 and the OR-gates 461, 463 and 465 are similar to the corresponding units of FIG. 4. Furthermore, multicore chip 500 includes a mask logic unit 580. In addition to expected result data, the mask logic unit 580 also provides mask data to the comparator logic units 560, 562 and 564.

Mask data are used when certain comparisons within the comparator logic units 560, 562 and 564 should not be taken into account for detecting mismatch. For example, in certain cases, unknown values might be shifted out of a scan chain, and therefore the related comparisons might not be useful. For example, it might be known that a certain test pattern results in a test result pattern in which not all values of the included test response bits are unambiguously defined. Furthermore, it might be known that certain logic gates associated with a certain scan chain are faulty, but for further diagnosis of the concerned core it would be desirable to analyze the circuitry of the concerned core by the other scan chains anyway. In another case, it might be already known that one of the multiple cores is faulty and therefore mismatch information should only be derived for the other cores of the multicore chip.

In the embodiment of FIG. 5, comparator logic units 560, 562 and 564 receive test result patterns from the multiple cores 430, 440 and 450, similarly as shown in FIG. 4. Furthermore, the multicore chip 500 receives expected result patterns at the expectation input 220, and this expected results patterns are provided to mask logic unit 580. Mask logic unit 580 is connected to the comparator logic units 560, 562 and 564 via two buses. Over one bus, the expected result patterns are provided from the mask logic unit 580 to the comparator logic units 560, 562 and 564. Over the other bus, mask information is provided from the mask logic unit 580 to the comparator logic units 560, 562 and 564. In an embodiment, the mask information is provided as n-bit mask pattern. The comparator logic units 560, 562, 564 compare the respective test result patterns of the multiple cores 430, 440 and 450 with the corresponding expected result patterns. Based on the comparison results, mismatch indications are generated and provided to a memory 570. In an embodiment, the comparison results output from the comparator logic units 569, 562 and 564 are provided to the OR-gates 461, 463 and 465 which output respective mismatch indication values for each core. These mismatch indication values may be provided as fail bits or pass bits to a memory.

In an embodiment, the memory may be a register 570 which may be accessible via a test access port (TAP). The characteristics of the TAP may be specified by the JTAG (Joint Test Action Group). In an embodiment, the memory may be a TAP accessible register 570. In an embodiment, all registers in the TAP accessible register 570 are initially set to 0 ("low"), and the OR-gates 461, 463 and 465 provide a value of one ("high") if the comparison vectors output from the comparator logic units 560, 562 and 564 indicate any mismatch. Such registers may maintain the value of one for the complete test period so that the information that there has been any mismatch in the test process for the respective core is not lost. In another embodiment, the registers are initially set to a value of one ("high") and the OR-gates provide a value of 0 ("low") in case of any indicated mismatch. Such registers may maintain the value of 0 for the complete test period so that the information that there has been any mismatch in the test process for the respective core is not lost. The fail bit register 570 may be read out via a test access port (TAP) and that cores that did not pass the test may be identified by the corresponding fail bits.

Figure 6:
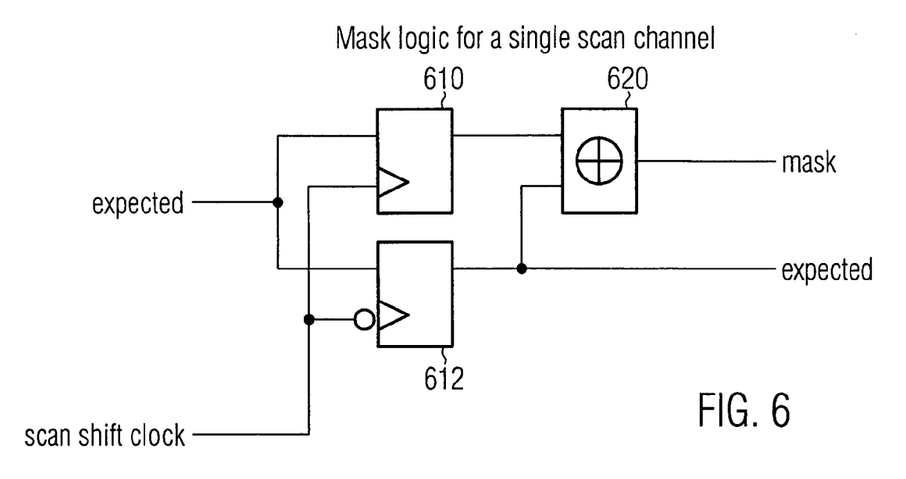
FIG. 6 is a block diagram illustrating a mask logic for a single scan channel according to an embodiment.

FIG. 6 shows an example for the mask logic unit 580 according to an embodiment. The mask logic is illustrated for a single scan channel. The mask logic unit 580 is supplied with a scan shift clock and expected input bit data.

The mask data may be derived from the expected result data as follows: if a value at these inputs is stable for the whole scan cycle, then a comparison with this value is valid; and if a value at the inputs switches between the "on" and "off" phase of the clock during a single cycle, then the result of the related comparison should be masked. In this manner, expected result data and mask data for masking the comparison of certain values of the expected result data with result values output from the corresponding separate scan channels may be provided using one single input line. The single values of such mask data may therefore be regarded as scan chain mask bits.

FIG. 6 shows shift registers 610 and 612 whereas shift register 610 is triggered by the positive edge of a scan shift clock and shift register 612 is triggered by the negative edge of the scan shift clock. Furthermore, FIG. 6 shows an XOR-gate connected to the outputs of the shift registers 610 and 612.

Therefore, when the value of an expected result bit switches within a single scan clock cycle, the XOR-gate 620 always outputs a "1", which is provided as mask data to the respective comparator logic unit. When the value of the expected result bit does not change within the clock cycle, the output of the XOR-gate 620 is always "0", meaning that the concerned comparison in the concerned comparator logic unit should not be masked. The value on the output line named "expected" corresponds always to the value of the input line named "expected".

Figure 7:
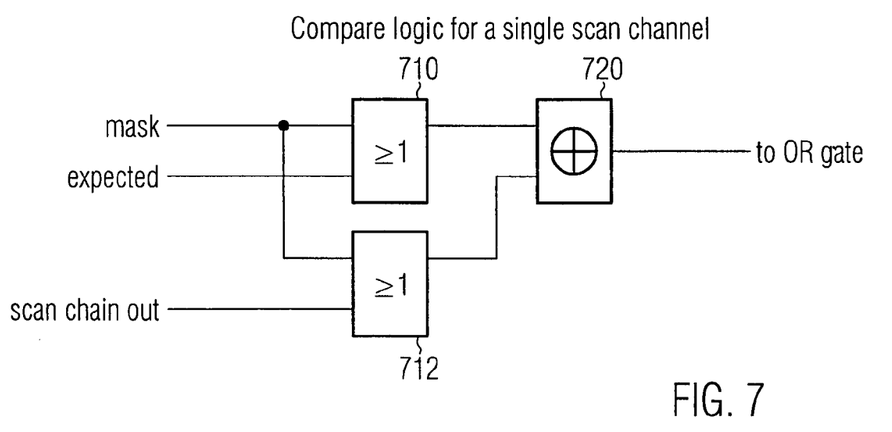
FIG. 7 is a block diagram illustrating a compare logic for a single scan channel according to an embodiment.

FIG. 7 shows an example for a compare logic for a single scan channel, which may be used in combination with the mask logic of FIG. 6. An OR-gate 710 is shown, to which mask data and expected data are input. Furthermore, there is another OR-gate 712, to which mask data and test result data are input. The outputs of the OR-gates 710 and 712 are connected to an XOR-gate 720, which provides a fail bit on its output which may be supplied to a fail bit register. If a "1" is input by the mask line, the output of the XOR-gate 720 is always a "0"; therefore, the comparison between the test result data and the expected result data is masked. In the case that the mask line provides a "0", the actual value of the expected result data and the test result data is compared, and in case of mismatch a fail bit is provided at the output of the XOR-gate 720.

In other embodiments, the compare logic may have a different internal structure. For example, the test result data and the expected result data may be supplied to an XOR-gate, whose output is supplied to a first input of an AND-gate. Furthermore, the mask line is supplied to an inverter whose output is supplied to a second input to the AND-gate. Therefore, the output of the AND-gate provides the same values as the output of the XOR-gate 720 of the example shown in FIG. 7.

For the embodiments shown in FIG. 6 and FIG. 7, it may be necessary that the corresponding pads and the ATE can operate at twice the frequency of scan shifting. Sometimes this might not be possible and then the period of the scan clock may be doubled so that the scan test of the multiple cores runs about twice as long as of a single core.

For each core, the compare logic consists of n basic blocks that compare the test response bit of the scan chains with the corresponding expected bit. If the related mask bit is set then in any case no mismatch is reported and the result is "0". The OR-sum of the results of the n basic blocks is "1" only when at least one of the non-masked comparisons failed. This sum is the input to the fail bit of the core, which is stored in the additional TAP-register.

Figure 8:
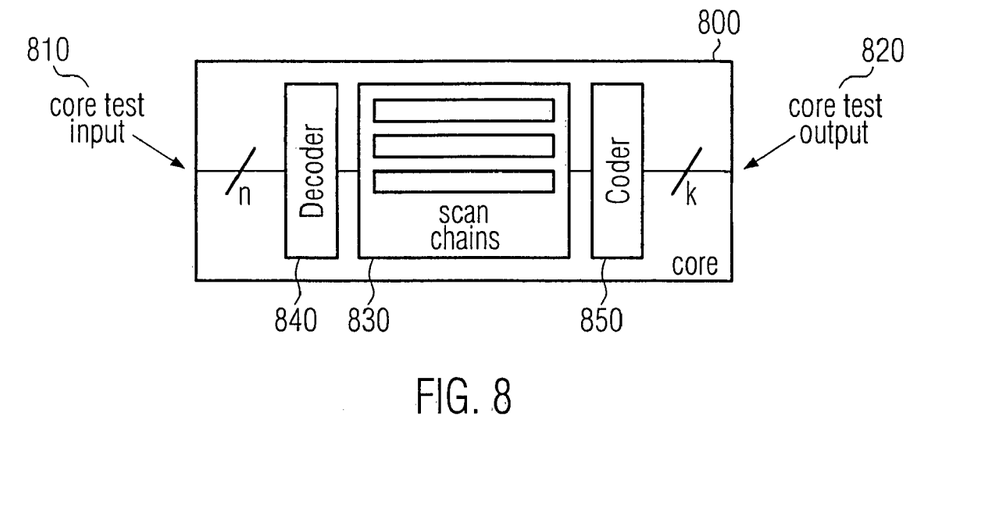
FIG. 8 is a block diagram illustrating a single core according to an embodiment.

FIG. 8 shows a single core 800 which may be alternatively used in embodiments in which the test data and the expected result data are provided to the multicore chip architecture in encoded form. This may be the case when a large number of scan chains 830 shall be operated by a small number of test input pins. This may be accomplished by core designs in which a core 800 comprises a decoder 840 in front of the scan chains, wherein the decoder 840 generates the full test data from compressed data received via the core test input 810. In this manner, a plurality of more than n scan chains 830 may be simultaneously provided with test input data even when the chip test input represents an input port with only n pins or pads, or when the core test input 810 is connected to the chip test input via an n-bit bus. Similarly, the core 800 may comprise a coder 850 at the end of the scan chains 830 to reduce the more than n test responses from the more than n scan chains 830 to the width k of the core test output 820. It should be noted that the embodiments described herein work with or without such a test data compression logic.

Furthermore, it should be noted that the width k of the core test output may be the same as the width n of the core test input, but needs not necessarily equal the width n of the core test input. However, in such cases in which the width k of core test output does not equal the width n of the core test input, the subsequent comparator logic of the herein described embodiments has to be adapted accordingly.

Figure 9:
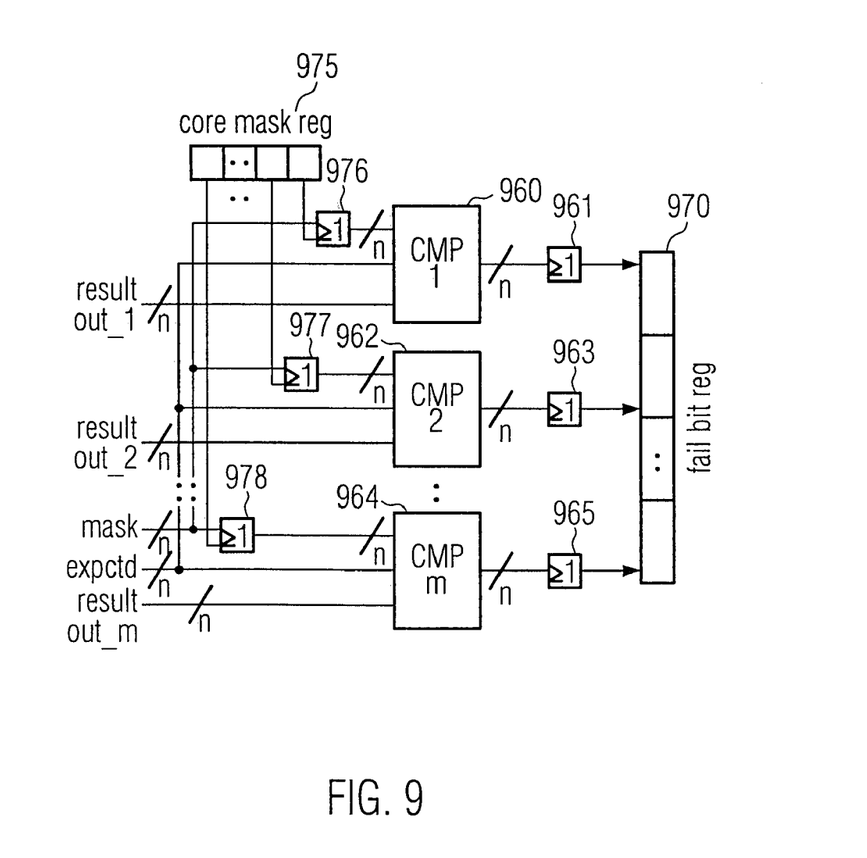
FIG. 9 is a block diagram illustrating a further embodiment which accounts for multiple mask data.

FIG. 9 illustrates an example of further embodiments in which additional mask data is provided to mask the mismatch detection for complete cores. For example, this may be useful if it is known that one of the multiple cores is totally broken.

In order to mask all mismatch detection results for one or more cores, a core mask register 975 has been added to the multicore chip architecture of the further embodiments. Each of the comparator logic units 960, 962 and 964 is supplied with expected result data and with test result data output from an associated core. Furthermore, the comparator logic units 960, 962 and 964 are supplied with a mask bit of the core mask register 975 which indicates whether or not the comparison shall be masked for a certain core.

For example, comparator logic unit 960 may receive a "1" from the core mask register 975. Then, similarly to the embodiment shown in FIG. 7, no "1" is output to the OR-gate 961, and therefore a "0" is stored in the fail bit register 970. Therefore, the mismatch detection is masked for that core to which the comparator logic unit 960 is associated. In the same manner, OR-gate 963 works together with comparator logic unit 962 and OR-gate 965 works together with comparator logic unit 964.

In further embodiments, this core mask approach can be combined with the scan channel mask approach described in conjunction with FIG. 7. For this purpose, an OR-gate 976 is shown in FIG. 9 to which a respective core mask bit may be supplied and also respective scan channel mask data. Then, a comparison—and therefore a mismatch detection—is masked in case that a core mask bit is set and also in case that respective scan channel mask data is provided. In the same manner, scan channel mask data and core mask data for comparator logic unit 962 can be considered both by means of OR-gate 977 and scan channel mask data as well as core mask data for comparator logic unit 962 can be considered both by means of OR-gate 978.

Figure 10:
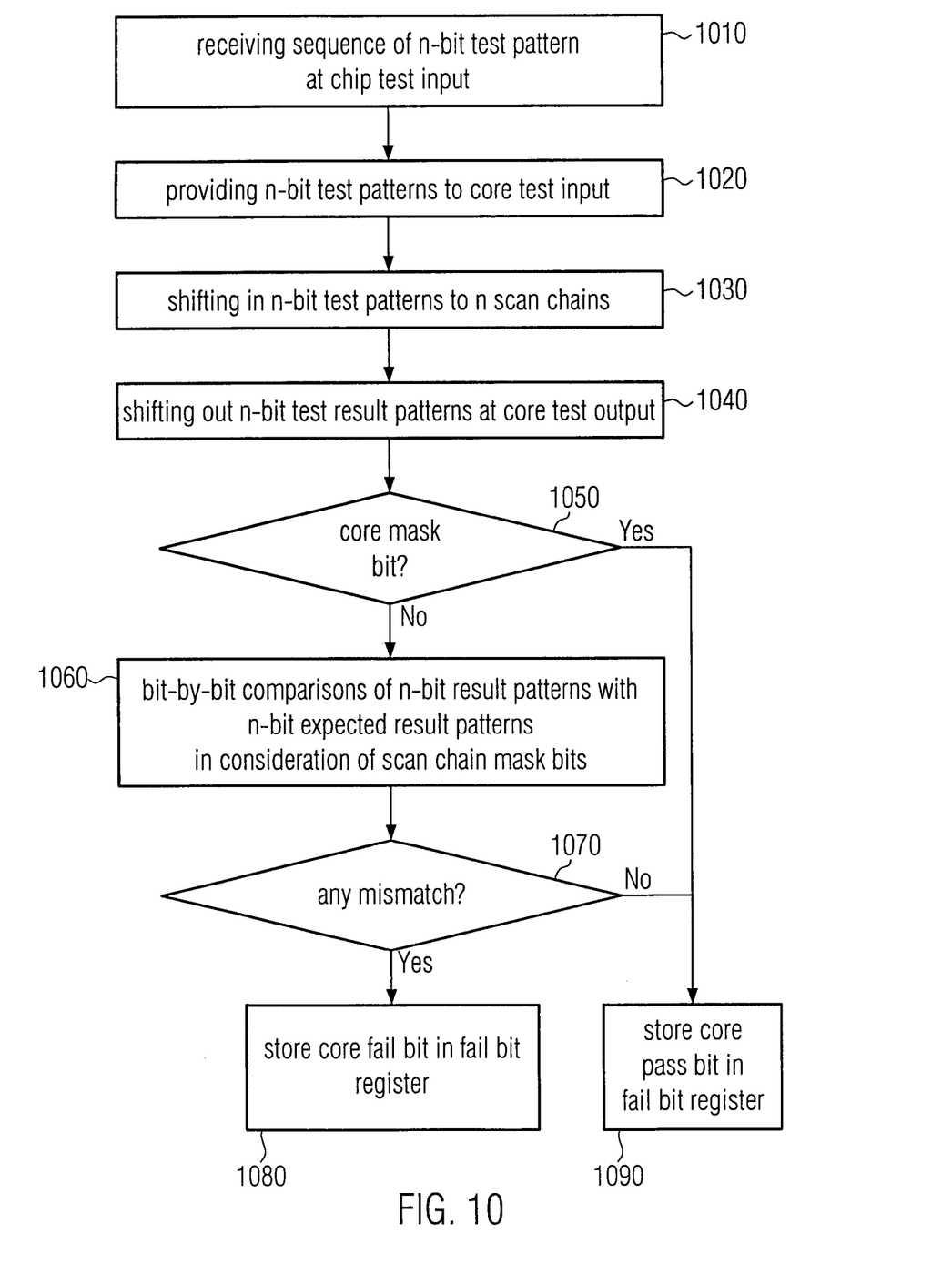
FIG. 10 is a flow chart illustrating a multicore chip testing process according to a further embodiment.

Referring now to FIG. 10, an exemplary multicore chip testing method is shown according to a further embodiment. In step 1010, a sequence of n-bit test patterns is received at a chip test input of the multicore chip. In step 1020, the received n-bit test patterns are supplied to the core test inputs of the multiple cores. In step 1030, the n-bit test patterns are shifted into the n scan chains. In step 1040, n-bit test result patterns are shifted out from the n scan chains and provided at the core test outputs of the multiple cores. In step 1050, it is decided whether there is a core mask bit set which indicates that mismatch detection should be masked for a certain core. If there is a core mask bit set, the process stores a core pass bit in a fail bit register in step 1090. Otherwise, the process proceeds to step 1060 in which for each bit of each n-bit result pattern a comparison is performed with its corresponding bit of the corresponding n-bit expected result patter. For each of this bit-by-bit comparisons, it is decided whether there is a scan chain mask bit is set indicating that a related comparison should be masked. If the bit-by-bit comparison should not be masked, a mismatch detected in step 1070 results in storing a core fail bit in the fail bit register in step 1080. If none of the comparisons of the n-bit result patterns with their corresponding expected result patterns results in a mismatch, a core pass bit may be stored in the fail bit register in step 1090. Therefore, a stored fail bit in the fail bit register indicates that at least one unexpected value occurred during the testing of the core associated with this fail bit. Otherwise, a core pass bit indicates that there has been no unexpected value for the concerned core during the whole testing process.

In further embodiments, all bits of the fail bit register are initially set to a value "core pass" before starting the multicore chip testing method, meaning that there are core pass bits initially stored. Then, block 1090 of FIG. 10 would not be necessary, as all bits of the fail bit register retain the value "core pass" as long as there is no mismatch detected in step 1070. Otherwise, when there is a mismatch detected in step 1070 the value "core pass" is overwritten with a value "core fail" in step 1080, meaning that there is a core fail bit stored in the fail bit register.

As already indicated in conjunction with FIG. 7, there are further embodiments in which the presence of mask bits may be considered after the comparison of the n-bit result patterns with the n-bit expected result patterns. That is, it may be first detected whether the bit-by-bit comparisons of n-bit result patterns with n-bit expected result patterns results in a mismatch, and then it may be determined whether there is a respective mask bit set. For example, step 1050 of FIG. 10 may be delayed until after step 1070. That is, when step 1070 results in a "Yes", it may be decided if there is a core mask bit set. According to the decision, the process proceeds to one of steps 1080 and 1090.

In further embodiments, an additional step of testing the mask data generation logic, the comparators and the fail bit register is performed before starting the above described multicore chip testing method.

As apparent from the above described embodiments, an integrated circuit chip architecture is provided which allows for efficiently testing multiple cores included in the integrated circuit chip.

In particular, the described embodiments allow for testing the multiple cores of a multicore chip with the same set of test data simultaneously. Furthermore, embodiments show that no additional input/output pins are required compared to testing a single core chip, meaning that the total number of input/output pins required for testing is independent from the number of cores to be tested in parallel. Furthermore, the described embodiments enable that the time for testing the cores of a multicore chip is nearly independent from the number of substantially similar cores included in the multicore chip. Therefore, no change in the test concept is required when the number of cores in the multicore chip design is increased.

In addition, further embodiments are shown in which expected result data and mask data for a single scan channel are provided using one single input line. In addition, embodiments are described in which additional mask data for masking mismatch detection for whole cores are provided and accordingly processed.

Furthermore, it is to be noted that the additional area needed to implement the provided embodiments is very small compared to the usual size of cores used in modern multicore chips.

While the invention has been described with respect to the physical embodiments constructed in accordance therewith, it will be apparent to those skilled in the art that various modifications, variations and improvements of the present invention may be made in the light of the above teachings and within the purview of the appended claims without departing from the spirit and intended scope of the invention. In addition, those areas in which it is believed that those of ordinary skill in the art are familiar, have not been described herein in order to not unnecessarily obscure the invention described herein. Accordingly, it is to be understood that the invention is not to be limited by the specific illustrative embodiments, but only by the scope of the appended claims.

What is claimed is:

1. An integrated circuit chip, comprising:
   a test input configured to receive test data;
   an expectation input for receiving expected result data;
      at least two circuitry cores, each core having a core test input and a core test output, each core being configured to receive test data from the test input at its core test input, to generate test result data according to the received test data, and further configured to provide the generated test result data at its core test output;
   comparator circuitry configured to compare for each core the test result data from the core test outputs and the received expected result data to detect for each core whether or not there is a mismatch between the test result data and the received expected result data;
   a mask logic unit which is configured to receive the received expected result data from the expectation input and to generate mask data from the expected result data by analyzing whether the values of expected mask data remain stable during a whole clock cycle, wherein the comparator circuitry is further arranged to receive mask data indicating for each of the circuitry cores whether or not the comparison of the test result data with the received expected result data is to be masked; and
   a memory configured to store for each core a mismatch indication.

2. The integrated circuit chip of claim 1, wherein each of the circuitry cores comprises at least one scan chain, each scan chain comprising a plurality of sequentially arranged flip-flops, a scan input connected with the core test input and a scan output connected with the core test output.

3. The integrated circuit chip of claim 2, wherein each of the circuitry cores comprises n scan chains, wherein n is an integer value greater than or equal to 1, and the comparator circuitry comprises for each circuitry core one comparator logic unit, and wherein the integrated circuit chip is configured to provide the test data as a sequence of n-bit test patterns to the n scan chains of each circuitry core and the received expected result data as a sequence of corresponding n-bit result patterns to the comparator logic units.

4. The integrated circuit chip of claim 3, wherein each of the comparator logic units comprises one n-bit comparator configured to compare an n-bit test pattern to an expected result pattern bit-by-bit and to output an n-bit comparison vector.

5. The integrated circuit chip of claim 4, further comprising one logic gate for each of the comparator logic units, wherein the logic gates are configured to receive the n-bit comparison vectors from the n-bit comparators and to generate a fail bit to be stored in the memory if at least one bit of the received n-bit comparison vector indicates a comparison mismatch.

6. The integrated circuit chip of claim 5, wherein the memory comprises a fail bit register comprising one memory bit for each core.

7. The integrated circuit chip of claim 6, wherein the bits of the fail bit register can be read out through a test access port of the integrated circuit chip.

8. The integrated circuit chip of claim 3, further comprising a scan shift clock used for providing the corresponding n-bit sequences of test patterns and expected result patterns to the n scan chains and the comparator logic units, respectively.

9. The integrated circuit chip of claim 1, further comprising distributing circuitry for concurrently providing received test data from the test input to the core test inputs of the at least two circuitry cores.

10. The integrated circuit chip of claim 1, wherein each circuitry core comprises decoder circuitry for decoding test data received at the core test input and coder circuitry for coding test result data provided at the core test output.

11. A method for an integrated circuit chip for testing the circuitry of at least two circuitry cores included in the integrated circuit chip, the method comprising:
   receiving test data at a test input of the integrated circuit chip and expected result data at an expectation input of the integrated circuit chip providing the received test data to the core test inputs of each of the circuitry cores;
   generating, in each circuitry core, test result data according to the received test data, and outputting the generated test result data at a core output of the respective circuitry core;
   generating mask data from the expected result data by analyzing whether the values of expected mask data remain stable during a whole clock cycle;
   receiving mask data indicating for each of the circuitry cores whether or not the comparison of the test result data with the received expected result data is to be masked;
   detecting whether or not there is a mismatch between the test result data and the expected result data by on-chip comparing the test result data of each of the circuitry cores with the expected result data; and
   on-chip storing, for each of the at least two circuitry cores, in a memory a mismatch indication indicating whether or not there is a detected mismatch.

12. The method of claim 11, wherein the test data are received as sequence of n-bit test patterns and the expected result data are received as sequence of n-bit expected result patterns, wherein n is an integer value greater than or equal to 1.

13. The method of claim 12, wherein each of the circuitry cores comprises a plurality of n scan chains and wherein said generating test result data comprises sequentially shifting in the received n-bit test patterns into the n scan chains, applying the n-bit test patterns to the circuitry of the respective core, and sequentially shifting out resulting test result patterns from the n scan chains.

14. The method of claim 12, wherein said detecting comprises masking the on-chip comparison for a test result pattern resulting from a certain test pattern if a test mask indication for this certain test pattern is received.

15. The method of claim 11, wherein said detecting comprises masking the on-chip comparison for a certain core if a core mask indication for this certain core is received.

16. The method of claim 11, further comprising decoding the test data provided to the circuitry cores and coding the generated test result data.

17. The method of claim 11, further comprising reading out the mismatch indications for the circuitry cores from the memory.

18. The method of claim 17, wherein the mismatch indications are stored in registers which are accessible via a test access port and read out via said test access port.

\* \* \* \* \*